United States Patent [19]
Banholzer et al.

[11] Patent Number: 5,958,198
[45] Date of Patent: Sep. 28, 1999

[54] CLAMP RING FOR DOMED HEATED PEDESTAL IN WAFER PROCESSING

[75] Inventors: Thomas J. Banholzer; Dan Morohl, both of San Jose, Calif.

[73] Assignee: Applied Materials, Inc., Santa Clara, Calif.

[21] Appl. No.: 09/022,231

[22] Filed: Feb. 11, 1998

Related U.S. Application Data

[62] Division of application No. 08/295,182, Aug. 24, 1994, Pat. No. 5,725,718, which is a continuation of application No. 08/037,988, Mar. 24, 1993, abandoned, which is a continuation of application No. 07/967,076, Oct. 27, 1992, abandoned.

[51] Int. Cl.$^6$ .................................................... C23C 14/50
[52] U.S. Cl. ............................ 204/298.15; 204/298.09; 156/345; 118/725; 118/728; 118/729
[58] Field of Search ................. 204/298.15, 298.09; 156/345; 118/725, 728, 729

[56] References Cited

U.S. PATENT DOCUMENTS 5,169,684  12/1992  Takagi ...................................... 118/728
5,223,112  6/1993  Tepman .............................. 204/298.15
5,228,501  7/1993  Tepman et al. .......................... 118/728

*Primary Examiner*—Nam Nguyen
*Assistant Examiner*—Rodney G. McDonald
*Attorney, Agent, or Firm*—Cooley Godward LLP

[57] ABSTRACT

A substrate processing chamber, in which the chamber houses a domed pedestal for supporting a substrate inside the chamber and a clamp ring having a seat formed therein. The chamber also houses a lift mechanism configured to receive the substrate and move it in close proximity to the clamp ring so that, upon transfer on the substrate from the lift mechanism to the pedestal, the clamp ring functions to secure the substrate to the pedestal. The lift mechanism includes a support having lift fingers to hold and center the substrate. The clamp ring includes a seat having a substrate engaging surface, which receives and holds down the periphery of the substrate onto the domed pedestal. In use the substrate engaging surface defines an angle to the horizontal which is greater than or equal to the angle to the horizontal defined by a tangent to the domed pedestal at the point where the periphery of the substrate is held down onto the pedestal. Typically the angle to the horizontal defined by the seat is about 3° greater than the angle of the tangent to the domed pedestal at the point where the substrate is held down onto the pedestal.

16 Claims, 3 Drawing Sheets

CLAMP RING FOR DOMED HEATED PEDESTAL IN WAFER PROCESSING

RELATED CASES

This application is a divisional of U.S. patent application Ser. No. 08/295,182 filed on Aug. 24, 1994 now U.S. Pat. No. 5,725,718 in the name of Banholzer et al. which is a continuation of Ser. No. 08/037,988 filed Mar. 24, 1993 (abandoned) which is a continuation of Ser. No. 07/967,076 filed Oct. 27, 1992 (abandoned).

BACKGROUND OF THE INVENTION

1. Field of the Invention

This invention relates to semiconductor wafer processing reactors and, more particularly, to an improved clamp ring for clamping a semiconductor wafer onto a domed heater pedestal used in such processing reactors.

2. Brief Description of the Prior Art

Semiconductor wafers are generally processed in thermal reactors in which the wafer is subjected to a number of different processing steps. In certain wafer processes, for example physical vapor deposition (PVD), often called sputtering, the wafer to be processed is held down onto a domed heating pedestal by means of some sort of clamping device such as a clamp ring. More details of the PVD/sputtering process itself, and the apparatus used for such processes are disclosed in U.S. Pat. No. 5,108,569 (Gilboa et al), and are incorporated by reference herein.

An example of a typical PVD wafer processing reactor and how a wafer is mounted therein before processing commences is illustrated with reference to FIG. 1, which is an exploded sectional view of the relevant internal components of the reactor.

Before wafer processing commences, a semiconductor wafer 10 is laterally brought into the reactor by means of a robot arm (not shown). Thereafter, a horseshoe-shaped wafer support 12 moves up from below the wafer 10 until the wafer is supported clear of the robot arm by the flat support faces 14 of four lift fingers 16 (of which only two are shown). In this position the robot arm lies within the open part 17 of the horseshoe-shaped support 12. Thereafter, the robot arm leaves the reactor, and the horseshoe-shaped support 12 continues to move upward. At the same time a wafer heating pedestal 18 moves vertically up into position near the underside of the wafer 10. As is shown in this figure, both the horseshoe-shaped support 12 and the pedestal 18 move vertically up (or down at the end of the processing cycle) along a common, central axis 19, indicated in broken lines.

The pedestal 18 has a domed upper surface and has an outer diameter only slightly smaller than that of the outer diameter of the wafer 10. To enable the pedestal 18 to move up through the center of the support 12 and past the lift fingers 16, four cutouts 20 are formed in the sides of the pedestal. These cutouts are large enough to accommodate the fingers 16 when the pedestal 18 moves up close to the underside of the wafer 10.

The pedestal 18 is typically made of stainless steel and, although not shown, includes a heater element for heating the pedestal 18. This, in turn, heats the wafer 10 during processing operations. To ensure that transfer of heat from the pedestal to the wafer is uniform, gas is injected into the space between the wafer and the pedestal via a gas conduit 22 which is formed in the pedestal 18 and exits in the center of its domed surface. Further details of how this is achieved will be given below.

The horseshoe-shaped support 12 lifts the wafer until it is close to, but not in contact with, a generally circular clamp ring 24. Thereafter, the pedestal 18 pushes up against the underside of the wafer 10, lifting it off the flat faces 14 of the lift fingers 16, and bringing it into contact with a flat faced, annular seat 26 formed in the clamp ring 24.

The pedestal 18 continues to move upward until the clamp ring 24 is lifted clear of its supports (not shown) and is supported only by the wafer 10 resting on the pedestal 18. As the clamp ring 24 is fairly heavy (approximately 3 pounds or 1.35 kilograms), it forces the wafer 10 to adopt approximately the profile of the dome of the pedestal 18. This configuration is illustrated in greater detail in FIG. 2, which is an enlarged detail of the area where the clamp ring 24 engages the edge of the wafer 10. It is in this position that the PVD/sputtering process steps occur.

FIG. 2 illustrates clearly the problem with the prior art clamp rings. As is apparent from this figure, the seat 26 is horizontal, while the pedestal, and accordingly the wafer when it conforms to the shape of the pedestal, are curved. As a result, the point of contact between the heavy clamp ring 24 and the wafer 10 is a sharp right-angled edge 30. The problem with this arrangement is that the wafer's surface can be damaged by the edge 30 gouging into it. Such damage can lead to undesirable particle generation during the processing operations and can result in strain lines from which chipping or flaking of the layers (deposited during subsequent wafer processing) on the surface of the wafer 10 can occur.

This problem is further enhanced when gas is injected into the gas conduit 22. This gas is used to ensure uniform heating of the wafer and is forced into the space between the backside of the wafer 10 and the pedestal 18. The gas, usually an inert gas such as argon, in the space behind the wafer is typically at a pressure of between 4 to 12 Torr while the interior of the reactor is at 4 to 10 milliTorr. As a result of this pressure differential the wafer flexes and bows away from the pedestal 18, with the greatest separation between wafer and pedestal occurring at the center of the wafer, a position indicated by broken lines 10'. Not only does this flexing cause even greater pressure to be exerted on the wafer's surface by edge 30 of the clamp ring 24, but it also causes the edge 30 to scrape the surface of the wafer 10 as the flexing of the wafer causes its outer edge to move inward toward its center.

In the past, attempts have been made to overcome this problem by very accurately machining and precision polishing the seat 26 and particularly the right-angled edge 30. This machining and polishing process requires a great deal of care by skilled operators and is therefore very costly.

Unfortunately, even the most careful polishing and resulting demurring of the right-angled edge 30 is still not sufficient to provide a totally defect-free edge 30. Any imperfections in this edge 30 act as concentration points for the stress generated by the clamp ring as it holds the wafer down onto the pedestal. These stress concentration points cause damage which can be particularly troublesome as a silicon wafer behaves much like a piece of glass; i.e., a small chip or score mark on the wafer's surface may propagate from the point of stress and shatter the wafer. Additionally, such scoring and marking of the wafer's surface disrupts its planarity. Thus, subsequent processing, for example with a material such as tungsten-CVD, which is difficult to bond to a wafer's surface even under ideal conditions, may not be possible with any measure of reliability as the tungsten may not be able to adhere to the damaged portion of the wafer's surface. As a result, the tungsten may tend to lift away from the entire wafer's surface during further processing thereof.

Other problems with the components of the reactor include an unstable wafer support due to the open-ended horseshoe-shaped support 12 and inexact positioning of the fingers 16. This second problem results from the method of manufacture of the support 12—it is first machined and thereafter the fingers 16 are welded onto it. Unfortunately this welding is very difficult to achieve accurately and has resulted in misaligned fingers.

The need therefore exists for a better and improved manner of clamping a semiconductor wafer onto a domed pedestal in a thermal reactor as well as improving the design of some of the other components within the reactor.

SUMMARY OF THE INVENTION

Accordingly, the present invention provides for an improved thermal reactor for processing a semiconductor wafer. The reactor includes a domed pedestal for supporting the wafer and controlling its temperature, and a clamp ring which includes an annular seat formed therein, for receiving and holding down the periphery of the semiconductor wafer onto the domed pedestal. The seat formed in the clamp ring includes a wafer engaging surface which engages and holds down the periphery of the wafer and which is formed to defined, in use, an angle to the horizontal which is greater than or equal to the elevational angle of a tangent to the domed pedestal at the point where the periphery of the wafer is held down onto the pedestal.

Preferably, the seat defines an angle of 4° to the horizontal. This angle is typically 3° greater than the elevational angle of the tangent to the domed pedestal at the point where the wafer is held down onto the pedestal.

In addition, the inner edge of the seat can be formed with a rounded corner, thereby reducing the chances of scoring the wafer's surface.

This invention has the advantage that the seat which holds the periphery of the wafer down onto the domed pedestal presents a much larger surface area to the upper surface of the wafer than in prior art devices.

Another advantage of this invention is that no sharp edges on the clamp ring bear onto the wafer surface. Accordingly, damage of the wafer's surface is minimized.

These and other advantages of the present invention will no doubt become apparent to those skilled in the art after having read the following detailed description of the preferred embodiment which is illustrated in the several figures of the drawing.

DETAILED DESCRIPTION

Figure 3:
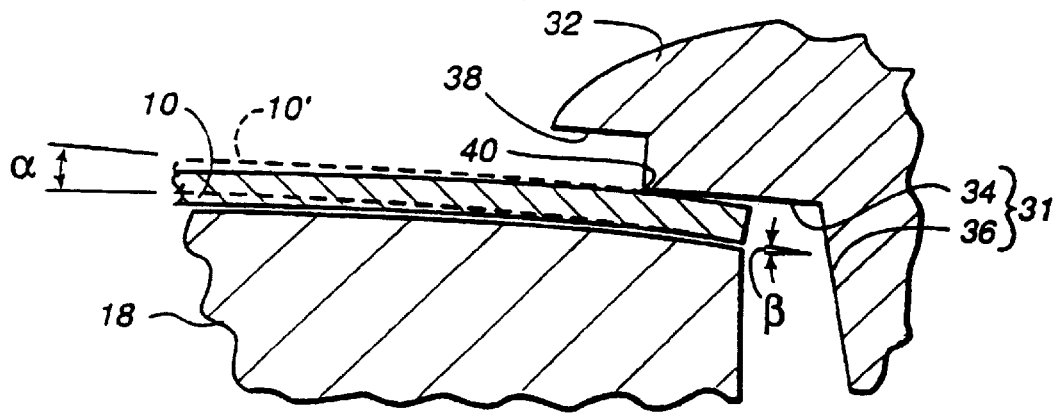
FIG. 3 is a section, similar to that of FIG. 2, illustrating one embodiment of the invention.

The basic principle of this invention is illustrated in FIG. 3. This figure is a cross-section illustrating how a semiconductor wafer 10 is held down onto a domed pedestal 18 by a stainless steel clamp ring 32 of the invention.

As is illustrated, the clamp ring 32 has an annular seat 31 formed therein. The seat 31 includes a wafer-engaging surface 34 and a sloped sidewall 36. The wafer engaging surface 34 is approximately 0.071" (1.8 mm) wide and holds the periphery of the wafer 10 down onto a domed heater pedestal 18 similar to that illustrated in FIG. 1. The clamp ring 32 also includes a roof portion 38 which is formed concentrically with the wafer-engaging surface 34, but is located inwardly thereof.

Figure 1:
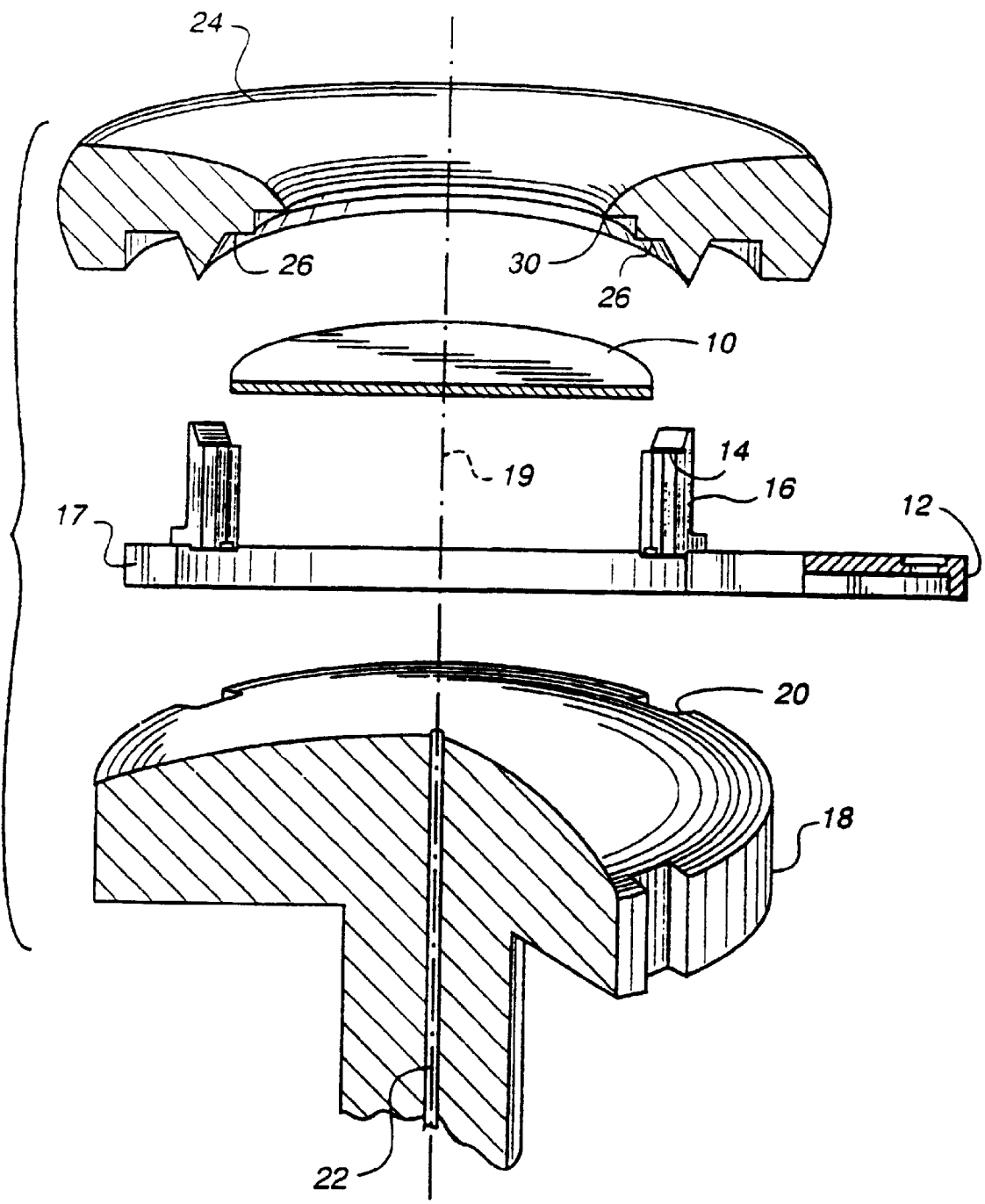
FIG. 1 is a partially sectioned, exploded view of the internal components of a semiconductor processing thermal reactor according to the prior art.
Figure 2:
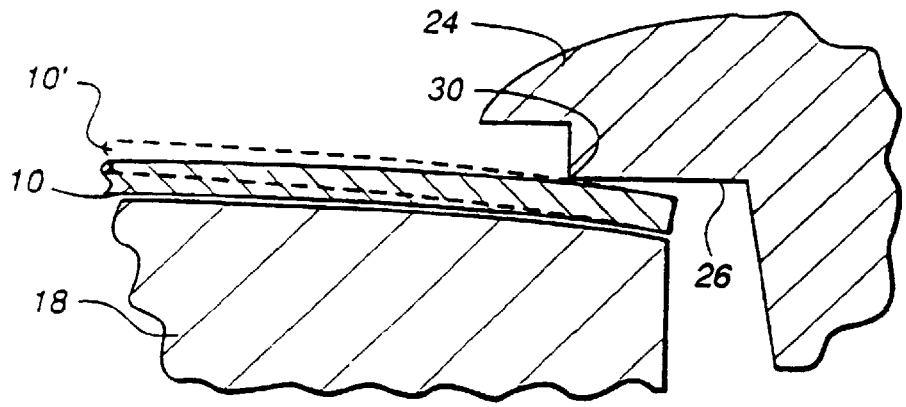
FIG. 2 is a detail of the clamp ring in FIG. 1 showing how the ring engages the wafer's surface.

As with the apparatus illustrated in FIGS. 1 and 2, the wafer assumes a domed profile roughly corresponding to that of the dome of the pedestal 18 when it is clamped onto the pedestal. However, in terms of this invention, the wafer-engaging surface 34 is formed so that, when it is in use, it defines an angle $\alpha$ to the horizontal. This angle $\alpha$ is greater than the angle $\beta$ between the tangent to the domed surface, at the point where the wafer is held down onto the pedestal 18, and the horizontal, that is, a plane perpendicular the central axis 19 along which the elements are moved. As illustrated in this figure, the curvature of the dome is greatly exaggerated to aid in illustration. Preferably, the angle $\alpha$ is at least 1° larger than the angle $\beta$. In actuality, the angle $\beta$ is approximately 1°. Typically, the angle $\alpha$ will be approximately 4°.

As a result of this arrangement, when gas is injected into the space between the backside of the wafer 10 and the pedestal 18 (as described with reference to the prior art) and the wafer bulges to the position 10' indicated in broken lines, a substantial amount of contact area is presented, by the wafer-engaging surface 34, to the upper surface of the wafer 10. In addition, as angle $\alpha$ is much greater than angle $\beta$, this allows for a substantial flexing of the wafer 10 before the inner edge 40 of the wafer-engaging surface 34 comes into contact with the surface of the wafer.

As the periphery of the wafer 10 is supported by a flat surface, as opposed to the sharp edge of the prior art devices, the marking of its upper surface is substantially reduced. Furthermore, it has been found that the clamp ring of this invention holds the periphery of the wafer down onto the pedestal 18 so that a better seal is formed, between the pedestal and the periphery of the wafer, which reduces the amount of pressurized gas from escaping from underneath the wafer. Accordingly, the pressure of the gas can be increased by between 6% to 10% which allows for greater uniformity of heating across the surface of the wafer.

From this figure, it will also be noted that the sidewall 36 of the clamp ring is angled back from the vertical. Typically, this angle is in the region of 10°. This angled sidewall 36, in addition to defining the outer edge of the wafer-engaging surface 34, also serves to guide the wafer and pedestal as these move up toward the clamp ring 32.

Figure 4:
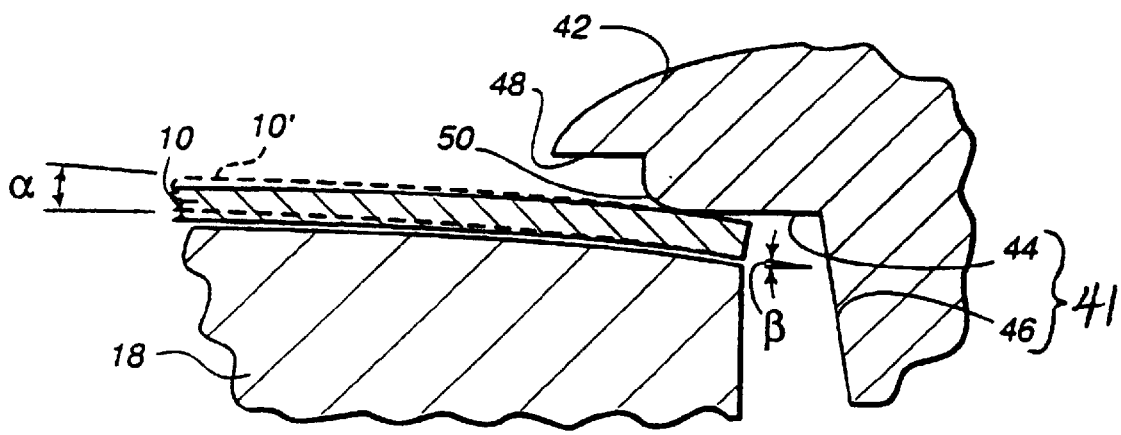
FIG. 4 is a figure similar to that in FIG. 3, illustrating a different embodiment of the invention.

An alternative embodiment to that illustrated in FIG. 3 is illustrated in FIG. 4. In this figure, the clamp ring 42 has its wafer-engaging surface 44 angled at approximately 1° to the horizontal. This angle is still equal to or greater than the angle $\beta$ (between the tangent and the horizontal) and therefore still allows the wafer 10 to flex to the position 10'. The clamp ring 42 includes a sidewall 46 and a roof portion 48 similar to corresponding elements in FIG. 3.

In addition, the interior edge 50 of the wafer-engaging surface 44 is rounded with a radius of curvature of approximately 0.023" (0.58 mm) or greater. As a result of this configuration, there is no way in which the flexing wafer can be engaged by a sharp 90° edge but is, instead, presented with a rounded surface. This in turn reduces the possibility of damage to the wafer's upper surface.

Figure 5:
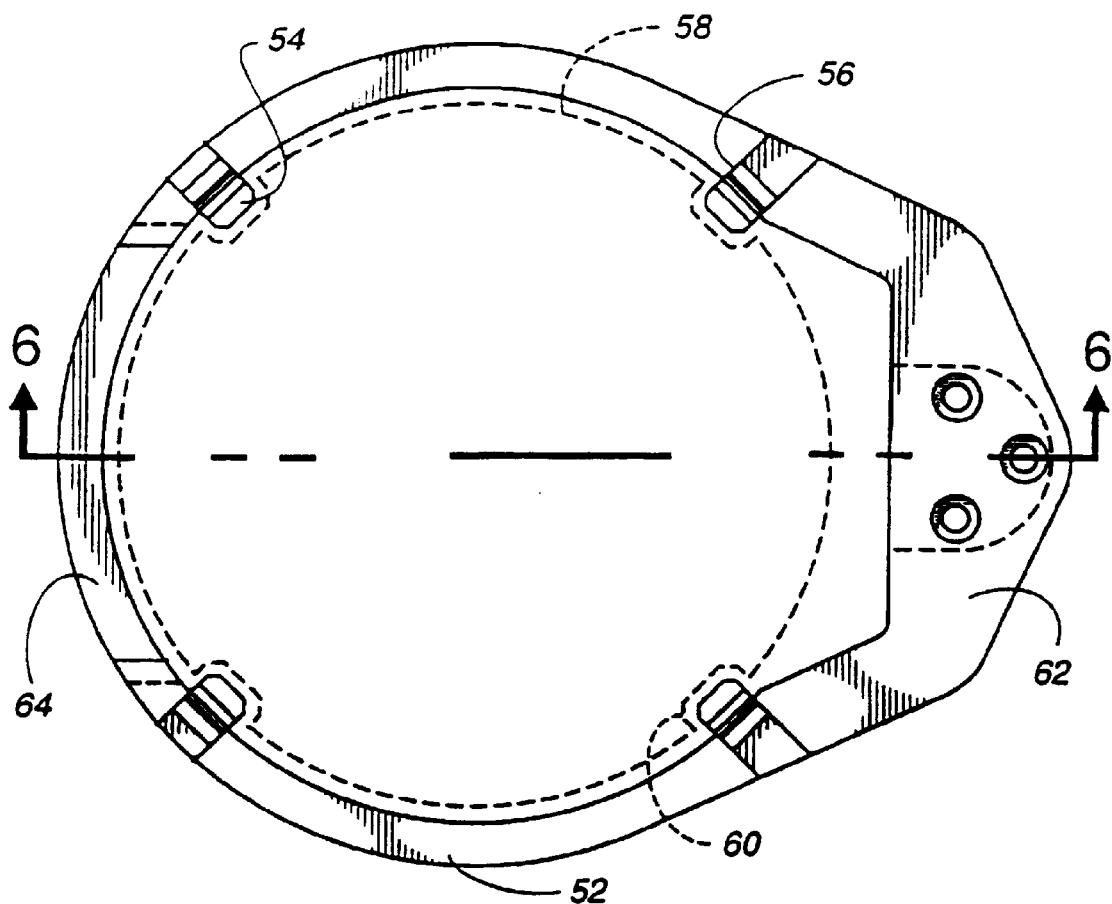
FIG. 5 is a plan view of a wafer support ring and a domed pedestal.
Figure 6:
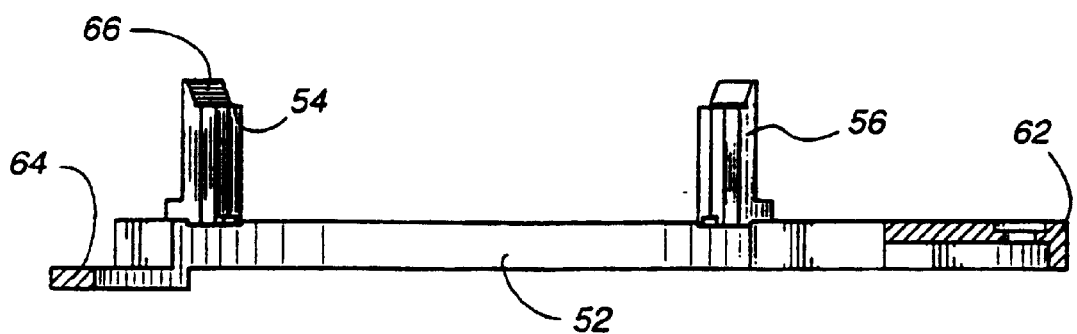
FIG. 6 is a section along line 6—6 in FIG. 5.

In FIGS. 5 and 6, referred to here jointly, details of an improved wafer support 52 and its associated lift fingers 56 are illustrated. From FIG. 5, it can be seen that the support 52 takes the form of a continuous ring as opposed to the horseshoe-shape of prior art support. In addition, the position of a heater pedestal 58 is also shown (in broken lines) in FIG. 5. From this figure, the cutouts 60 in the pedestal 58 and the manner in which the wafer lift fingers 56 fit into these cutouts are clearly evident.

From both FIGS. 5 and 6 it can be seen that the wafer support ring 52 can be attached to a standard lifting mechanism (not shown) at an attaching tab 62 on one side of the ring 12. This is typically done by riveting the tab 62 down onto the lifting mechanism.

At the opposite side of the ring 52 to the tab 62, a stepped-down brace 64 is formed between the arms of the horseshoe ring 52. This stepped brace 64 effectively lowers the top of the ring 52 at this section and provides an entrance passageway for a robot arm which inserts and removes the wafer from the thermal reactor. If it were not for this stepped brace 64, the horseshoe-shaped support of the prior art would be required. It will be apparent that the closed ring is advantageous as it provides a more sturdy support for the fingers than the open ended horseshoe shape.

The lift fingers, as can be seen from FIG. 6 in particular, have flat wafer support faces 54 which engage the wafer to lift it off the robot arm. To ensure that this can be done and that the wafer is positioned accurately on the lift fingers, each lift finger 56 has a sloping side 66 which serves to guide the wafer down into position onto the support faces 54. To ensure that the fingers themselves are positioned correctly onto the ring, the fingers are welded onto the ring during the initial manufacturing steps. Thereafter the ring is machined together with the fingers, thereby ensuring that the fingers are accurately positioned with respect to both the support ring and the clamp ring with which they will interact with during wafer loading and unloading.

Although the present invention has been described above in terms of a specific embodiment, it is anticipated that alterations and modifications thereof will no doubt become apparent to those skilled in the art. For example this invention could be applied in wafer etching apparatus where, instead of a continuous wafer engaging surface 34, an intermittent engaging surface is provided. Furthermore, the pedestal can be used for cooling as well as heating. Also, the precise shape of the dome is not critical to this invention and the wafer need not be a semiconductor wafer but could be a substrate of another material type. It is therefore intended that the following claims be interpreted as covering all such alterations and modifications as fall within the true spirit and scope of the invention.

What is claimed is:

1. A substrate support apparatus for supporting a substrate within a processing chamber, comprising:
    (a) a moveable pedestal including a substrate supporting surface;
    (b) a clamp having a substrate engaging surface, configured to engage and secure the substrate against the supporting surface of the pedestal; and
    (c) a moveable, horseshoe-shaped substrate lift mechanism defining a primary plane and configured to position the substrate in proximity to the clamp and lift mechanism, the lift mechanism including
        (i) an inner edge defining a central opening, sized to receive an outer periphery of the substrate supporting surfaces;
        (ii) an open side;
        (iii) a plurality of lift fingers arranged along a periphery of the lift mechanism, the lift fingers designed to support the substrate in a plane substantially parallel to the primary plane; and
        (iv) a stepped brace secured to the lift mechanism and spanning its open side,
        the pedestal, clamp and lift mechanism arranged to cooperate such that, upon movement of the pedestal through the lift mechanism central opening, the substrate is transferred from the lift mechanism to the supporting surface of the pedestal, and into engagement with the clamp, such that the clamp, engaging a periphery of the substrate, secures the substrate against the supporting surface of the pedestal.

2. The apparatus of claim 1, wherein each lift finger includes a seat configured to engage the periphery of the substrate.

3. The apparatus of claim 2, wherein the substrate supporting surface of the pedestal is dome shaped.

4. The apparatus of claim 3, wherein an angle formed between a horizontal and the substrate engaging surface is greater than the angle formed between the horizontal and tangent on the dome shaped surface of the pedestal where the clamp secures the substrate against the pedestal.

5. The apparatus of claim 4, wherein the substrate engaging surface forms an angle of about 4° to the horizontal.

6. The apparatus of claim 4, wherein the angle formed between the horizontal and the substrate engaging surface is at least 1° greater than the angle formed between the horizontal and the tangent.

7. The apparatus of claim 6, wherein the angle formed between the horizontal and the substrate engaging surface is about 3° degrees greater than the angle formed between the horizontal and the tangent.

8. The apparatus of claim 7, wherein the substrate conforms to the shape of the surface of the dome shaped surface when the clamp secures the substrate against the pedestal.

9. The apparatus of claim 8, further comprising a fluid transport conduit formed in the pedestal to exit at an interface between the pedestal surface and the substrate, the fluid transport conduit configured to inject fluid at an interface between the pedestal surface and the substrate such that, in operation, the fluid lifts at least part of the substrate from the top surface of the pedestal.

10. The apparatus of claim 9, wherein the pedestal includes a heater element which, in use, heats the pedestal, to heat the fluid which, in turn, heats the substrate.

11. The apparatus of claim 3, wherein the substrate engaging surface is rounded.

12. The apparatus of claim 11, wherein the substrate conforms to the shape of the dome shaped surface when the clamp secures the substrate against the pedestal.

13. The apparatus of claim 12, further comprising the fluid transport conduit formed in the pedestal to exit at an interface between the pedestal surface and the substrate, the fluid transport conduit configured to inject fluid at the interface between the pedestal surface and the substrate such that the fluid lifts at least part of the substrate from the top surface of the pedestal.

14. The apparatus of claim 13, wherein the pedestal includes a heater element which, in use, heats the pedestal to heat the fluid which, in turn, heats the substrate.

15. A lift mechanism for mounting within a chamber defined in a substrate processing reactor, the lift mechanism comprising:

(a) a generally horseshoe-shaped substrate support defining a primary plane and having an open end;

(b) a plurality of lift fingers attached on the support and capable of supporting a substrate along its periphery such that, when supported, a major surface of the substrate is parallel to the primary plane;

(c) a brace spanning and secured to the open end of the support wherein the brace is parallel to but offset from the primary plane, thereby defining an entrance passage that permits a transferring mechanism to place the substrate onto the lift mechanism; and (d) a drive mechanism capable of being coupled to the support to move the support in a direction perpendicular to the primary plane,
    wherein the brace is parallel to, but offset from, both the primary plane and the plane occupied by the substrate when positioned on the lift fingers, thereby defining a passage in which a transfer mechanism can move to place the substrate onto, or remove the substrate from, the lift mechanism.

16. The lift mechanism of claim 15, wherein each lift finger includes:

(a) support faces configured to support the substrate along its periphery; and (b) a sloping side, facing the central region of the horseshoe-shaped support, whereby, collectively, the sloping sides serve to guide the substrate onto the support faces when the transfer mechanism acts to position the substrate onto the lift mechanism.

* * * * *